United States Patent [19]
Cunningham

[11] Patent Number: 6,087,214
[45] Date of Patent: Jul. 11, 2000

[54] ARRANGEMENT AND METHOD FOR DRAM CELL USING SHALLOW TRENCH ISOLATION

[75] Inventor: James A. Cunningham, Saratoga, Calif.

[73] Assignee: VLSI Technology, Inc., San Jose, Calif.

[21] Appl. No.: 09/069,429

[22] Filed: Apr. 29, 1998

[51] Int. Cl.[7] ................................................. H01L 21/70
[52] U.S. Cl. ..................... 438/244; 438/243; 438/246; 438/388; 438/424; 257/296; 257/305
[58] Field of Search .................................. 438/244, 243, 438/246, 389, 386, 391, 390, 394, 395, 399, 426; 257/296, 301, 303, 305, 313, 396, 397, 510, 513, 522

[56] References Cited

U.S. PATENT DOCUMENTS

| | | | |
|---|---|---|---|
| 4,617,071 | 10/1986 | Vora | 438/333 |
| 4,637,836 | 1/1987 | Flatley et al. | 438/585 |
| 4,645,564 | 2/1987 | Morie et al | 438/388 |
| 4,731,342 | 3/1988 | Ishiuchi | 438/243 |
| 4,830,981 | 5/1989 | Baglee et al. | 438/243 |
| 4,833,099 | 5/1989 | Woo | 438/230 |
| 4,842,675 | 6/1989 | Chapman et al. | 438/425 |
| 5,027,185 | 6/1991 | Liauh | 257/413 |
| 5,185,284 | 2/1993 | Motonami | 438/244 |
| 5,364,803 | 11/1994 | Lur et al. | 438/592 |
| 5,545,925 | 8/1996 | Hanaoka | 257/755 |
| 5,793,075 | 8/1998 | Alsmeier et al. | 257/296 |
| 5,811,347 | 9/1998 | Gardner et al. | 438/435 |

OTHER PUBLICATIONS

C.T. Liu et al. "High Performance 0.2$\mu$m CMOS with 25 Å Gate Oxide Grown on Nitrogen Implanted Si Substrates", IEDM 96–499, 1996.

Hidetoshi Koike et al., "Dual–Polycide Gate Technology Using Regrowth Amorphous–Si to Suppress Lateral Dopant Diffusion", IEEE Transactions on Electron Devices, vol. 44, No. 9, Sep. 1997.

Charles L. Chu et al., "Technology Limitations fir N+/P+ Polycide Gate CMOS due to Lateral Dopant Diffusion in Silicide/Polysilicon Layers", IEEE Electron Device Letters, vol. 12, No. 12, Dec. 1991.

I. Suni et al., "Thermal Oxidation of Reactively Sputtered Titanium Nitride and Hafnium Nitride Films", J. Electrochem Soc.: Solid–State Science and Technology, May 1993.

B. El–Kareh et al. "The evolution of DRAM cell technology", Solid State Technology, May, 1997.

Billy L. Crowder et al. 1 $\mu$m MOSFELT VLSI Technology: Part VII–Metal Silicide Interconnection Technology–A Future Perspective, IEEE Transactions on Electron Devices, vol. ED–26, No 4, Apr. 1979.

T. Paul Chow et al. Refractory Metal Silicides: Thin Film Properties and Processing Technology, IEEE Transactions on Electron Devices, vol. ED–30, No. 11, Nov. 1983.

K. Fujii et al. A Thermally Stable Ti–W Salicide for Deep–Submicron Logic with Embedded DRAM, IEDM 96–451.

Marc Wittmer "Properties and microelectric applications of thin films of refractory metal nitrides", J. Vac. Sci. Technol. A 3 (4), Jul/Aug. 1985.

(List continued on next page.)

*Primary Examiner*—Donald L. Monin, Jr.
*Assistant Examiner*—Hoai Pham

[57] ABSTRACT

A semiconductor structure uses a shallow trench isolation (STI) region to realize a capacitor trench of a reduced size. Consistent with one embodiment of fabricating a memory cell, the invention includes selectively removing portions of a substrate using a patterned mask to form a capacitor trench and an isolation trench at least partially around the capacitor trench. An oxide is formed in the isolation trench and the capacitor trench and the oxide so selectively removed in the capacitor trench. Portions of the substrate defining the base and sidewalls of the capacitor trench are then doped and a capacitor dielectric is formed in the capacitor trench, leaving a portion of the trench unfilled. A polysilicon layer is formed it the unfilled portion of the capacitor trench and over the capacitor dielectric to form a plate of the storage capacitor.

13 Claims, 3 Drawing Sheets

OTHER PUBLICATIONS

Effiong Ibok et al. "A characterization of the Effect of Deposition Temperature on Polysilicon Properties", J. Electrochem. Soc., vol. 140, No. 10, Oct. 1993.

S. Shimizu et al. "Impact of Surface Proximity Gettering and Nitrided Oxide Side–Wall Spacer by Nitrogen Implantation on Sub–Quarter Micron CMOS LDD FETs", IEDM 95–859.

M.T. Takagi et al. "A Novel 0.15 $\mu$m CMOS Technology using W/WNx/Polysilicon Gate Electrode and Ti Silicided Source/Drain Diffusions", IEDM 96–455.

Jerome B. Lasky et al. "Comparison of Transformation to Low–Resistivity Phase and Agglomeration of TiSi2 and CoSi2", IEEE Transactions of Electron Devices, vol. 38, No. 2 Feb. 1991.

Bijan Davari et al. "A High–Performance 0.25–$\mu$m CMOS Technology: II–Technology", IEEE Transactions on Electron Devices, vol. 39, No. 4 Apr. 1992.

G.E. Georgiou et al. "Thermal Stability Limits of Thin TiSi2", J. Electrochem. Soc., vol. 141, No. 5, May 1994.

Tomohisa Mizuno et al. "Si3N4/SiO2 Spacer Induced High Reliability in LDDMOSFET and Its Simple Degradation Model", IEDM 88.

D. Pramanik et al. "Formation of Titanium Silicide by Rapid Thermal Annealing", Semiconductor International, May, 1985.

M.Y. Tsai et al. "One–Micron Polycide (Wsi2 on Poly–Si) MOSFET Technology", J. Electrochem. Soc.: Solid–State Science and Technology, Oct. 1981.

B. Davari et al. "A High–Performance 0.25 $\mu$m CMOS Technology", IEDM 88.

A.K. Sinha et al. "Generic Reliability of the High–Conductivity TaSi2/n+ Poly–Si Gate MOS Structure", IEEE 1980.

Stefan Nygren et al. "Dual–Type CMOS Gate Electrodes by Dopant Diffusion from Silicide", IEEE Transactions on Electron Devices, vol. 36, No. 6, Jun. 1989.

A. Nishiyama et al. "A Thermally Stable Salicide Process Using N2 Implantation into TiSi2", IEEE VMIC Conference, Jun. 12–13, 1990.

Keith A. Jenkins et al. "Identification of Gate Electrode Discontinuities in Submicron CMOS Technologies, and Effect on Circuit Performance", IEEE Transactions on Electron Devices, vol. 43, No. 5, May, 1996.

L.C. Parrillo et al. "A Fine–Line CMOS Technology That Uses P+ Polysilicon/Silicide Gates For NMOS and PMOS Devices", IEDM 84.

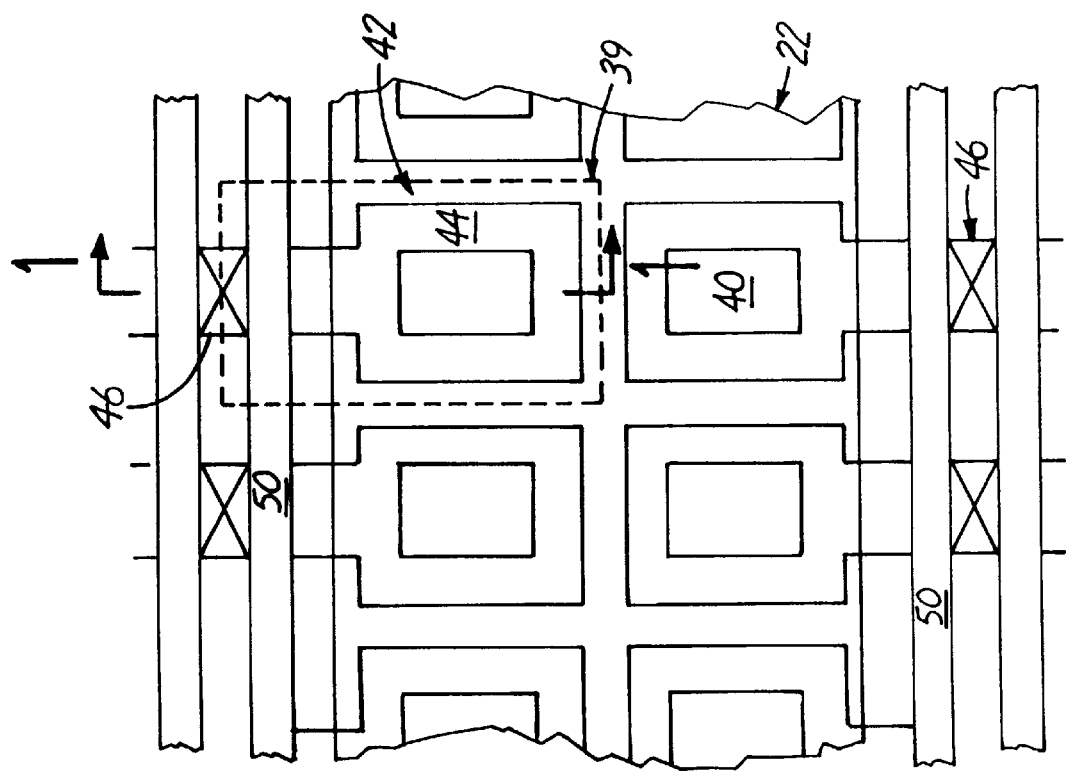

ARRANGEMENT AND METHOD FOR DRAM CELL USING SHALLOW TRENCH ISOLATION

FIELD OF THE INVENTION

This invention relates to semiconductor devices and their manufacture and, more particularly, to such devices and processes using a shallow trench isolation region to realize a relatively small-size capacitor. This invention relates to and may be used in conjunction with the teachings of U.S. patent application Ser. No. 09/018,711, entitled "Data Storage Circuit Using Shared Bit Line and Method Therefor," and of U.S. patent application Ser. No. 09/018,712, entitled "Layout for Data Storage Circuit Using Shared Bit Line and Method Therefor," both filed on Feb. 4, 1998 (Docket Nos. 11422.92US01 and 11422.94US01), and both assigned to the instant assignee and incorporated herein by reference.

BACKGROUND OF THE INVENTION

The electronics industry continues to strive for powerful, highly functional circuits. Significant achievements in this regard have been realized through the fabrication of very large-scale integrated circuits on small areas of silicon wafers. Integrated circuits of this type are manufactured through a series of steps carried out in a particular order. The main objective in manufacturing such devices is to obtain a device which conforms to geographical features of a particular design for the device. To obtain this objective, steps in the manufacturing process are closely controlled to ensure that rigid requirements, for example, of exacting tolerances, quality materials, and clean environment, are realized.

Dynamic random access memories (DRAMs) are a widely used memory type. They are oftentimes preferred over other memory types because they can be implemented to provide an extraordinary number of memory cells in a relatively small area. The vast majority of DRAMs are implemented using MOS (metal oxide semiconductor) technology, which refers to any integrated circuitry in which n-channel and/or p-channel field effect transistors are used.

MOS devices are fabricated from various materials, including electrically conductive, electrically nonconductive and electrically semi-conductive materials. A frequently-used semi-conductive material is silicon. Silicon can be made conductive by doping (i.e., introducing an impurity into the silicon crystal structure) with either an element such as boron or with an element such as phosphorus or arsenic. In the case of boron doping, electron holes become the charge carriers and doped silicon is referred to as positive or p-type silicon. In the case of phosphorus or arsenic doping, the additional electrons become the charge carriers and the doped silicon is referred to as negative or n-type silicon.

Silicon is used either in single-crystal or polycrystalline form. Polycrystalline silicon is referred to herein as "polysilicon" or as "poly." Due to its effectiveness as a conductor, polysilicon has been used in place of metal for many types of MOS applications. However, the higher connectivity characteristic of metal has motivated a number of semiconductor manufacturers to use a layer of refractory silicide on transistor gates to increase the device's speed.

Device speed, sometimes referred to as access time, has drawn significant attention in recent years. Particular attention has been given to increasing device speed while using ever-decreasing package sizes. For many DRAM applications, these efforts have been directed to using fewer elements to implement each memory cell in the DRAM array. For example, by using fewer transistors to implement each memory cell, the overall semiconductor real estate used per cell area can be decreased. A successful example of using one transistor to implement each memory cell is disclosed in the above-referenced U.S. patent application, entitled "Data Storage Circuit Using Shared Bit Line and Method Therefor."

Even with a reduced number of elements used to implement such memory cells, there continues to be a need to reduce the layout area as well as the integration area required for each cell. For example, memory cells of this type typically include a capacitor or other device designed to hold a charge representing a data bit. The size of the memory cell is partly dependent on the size of this charge-holding device. To sufficiently maintain the charge over an extended period of time and over a variety of environmental conditions, the charge-holding device is typically designed to be one of the larger elements in the memory cell. Such large devices have been the subject of these efforts to reduce the layout and integration used in designing such cells.

SUMMARY

According to various aspects of the present invention, embodiments thereof are exemplified in the form of methods and arrangements for fabricating a semiconductor structure using a shallow trench isolation region to realize a relatively small capacitor. One specific implementation is directed to a process of fabricating a memory cell, comprising: selectively removing portions of a substrate using a patterned mask to form a capacitor trench and an isolation trench at least partially around the capacitor trench; forming an oxide in the isolation trench and the capacitor trench; selectively removing the oxide in the capacitor trench; doping portions of the substrate defining the base and sidewalls of the capacitor trench; forming a capacitor dielectric in the capacitor trench, leaving a portion of the trench unfilled; and forming a polysilicon layer in the unfilled portion of the capacitor trench and over the capacitor dielectric to form a plate of the storage capacitor.

Another aspect of the present invention is directed to a dynamic random access memory (DRAM) cell, comprising: a substrate; a capacitor trench disposed in the substrate; an isolation trench disposed in the substrate, at least partially around the capacitor trench; a doped region disposed in portions of the substrate defining the base and sidewalls of the capacitor trench, the doped region forming a first plate of a storage capacitor; a capacitor dielectric disposed in part of the trench; and a polysilicon layer disposed in the trench over the capacitor dielectric, the polysilicon layer forming a second plate of the first storage capacitor and having sidewalls facing the trench sidewalls to increase the capacitance per unit area of the storage capacitor.

In another embodiment, a process of fabricating a dynamic random access memory cell having an access transistor and a storage capacitor, comprises: forming, over a substrate, a patterned nitride layer exposing portions of the substrate defining an isolation region and a capacitor region within the isolation region; etching exposed portions of the substrate using the patterned nitride layer to form an isolation trench in the isolation region and a capacitor trench in the capacitor region within the isolation region; oxidizing the substrate to form a thermal oxide layer in the isolation trench and the capacitor trench; depositing an oxide layer over the thermal oxide layer to fill unfilled portions of the isolation trench and the capacitor trench; removing the patterned nitride mask; planarizing the treated surface and then forming, over the substrate, a patterned photoresist layer selectively exposing the deposited oxide layer in the capacitor trench; selectively etching the deposited oxide layer and the thermal oxide layer in the capacitor trench using the patterned photoresist as a mask; doping portions of the substrate defining the base and sidewalls of the capacitor trench using the patterned mask, the doped region forming a first plate of the storage capacitor; removing the patterned photoresist; oxidizing the substrate to grow a capacitor oxide in the capacitor trench and a gate oxide over a region of the substrate near the capacitor trench; forming a polysilicon layer over the substrate; selectively removing portions of the polysilicon layer to form a second plate of the storage capacitor over the capacitor trench and a gate electrode of the access transistor over the gate oxide; and selectively doping regions of the substrate adjacent the gate electrode to form source/drain regions of the access transistor in the substrate, at least one source/drain region being coupled to the doped region forming the first capacitor plate.

The above summary is not intended to describe each illustrated embodiment or every implementation of the present invention. The figures described in the following detailed description more particularly exemplify these embodiments.

BRIEF DESCRIPTION OF THE DRAWINGS

Various aspects and advantages of the present invention will become apparent upon reading the following detailed description of various embodiments and upon reference to the drawings in which:

FIG. 2 illustrates a layout perspective of a DRAM array that includes the DRAM cell of FIG. 1, also in accordance with an example embodiment of the present invention;

Figure 1:
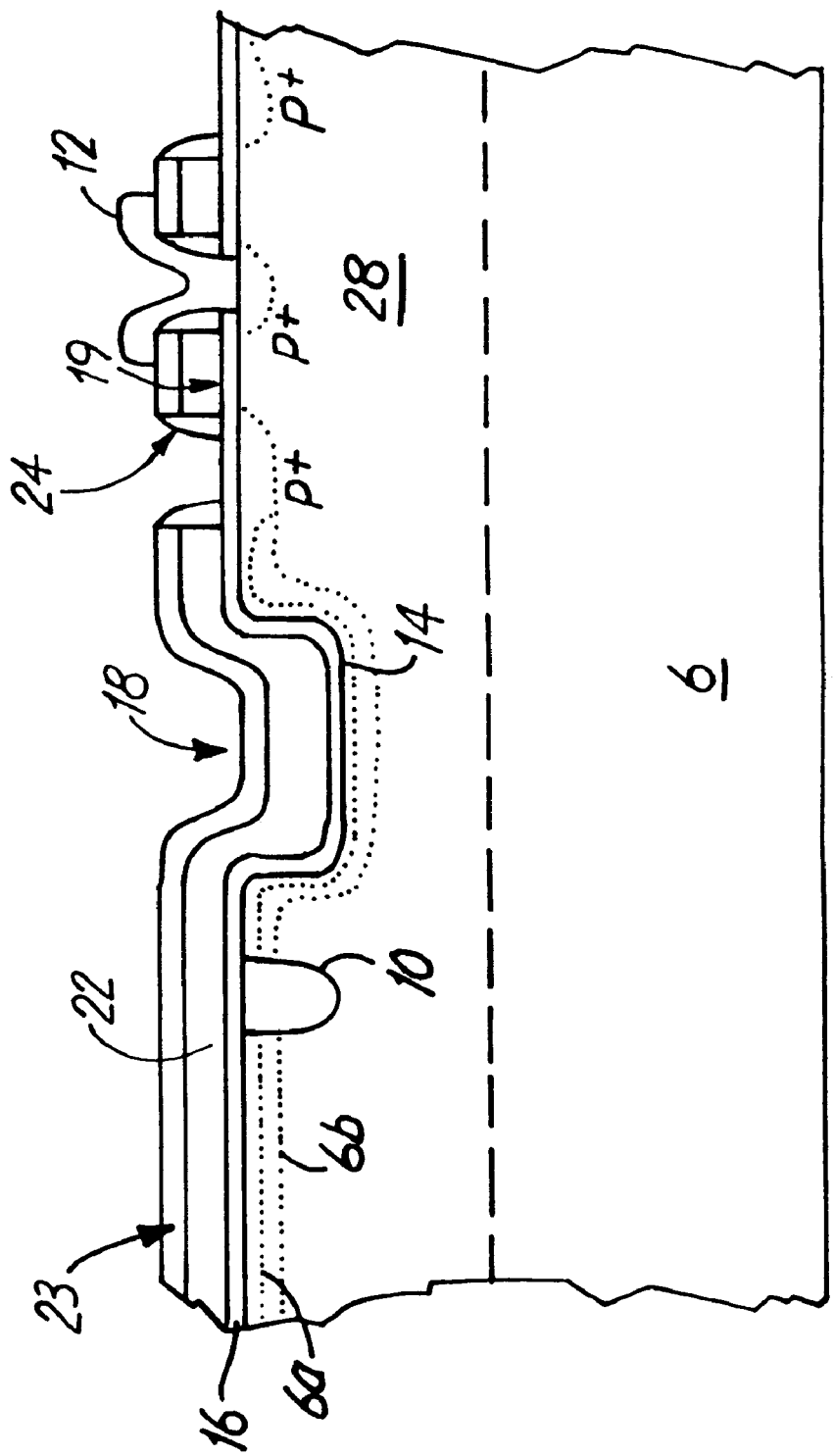
FIG. 1 illustrates a cross-sectional view taken in the direction of 1 of FIG. 2 of a portion of a DRAM cell, according to one example embodiment of the present invention.

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention may be applied to a variety of semiconductor structures and has been found to be particularly advantageous for use in connection with high density dynamic random access memory (DRAM) circuits. While the present invention is not so limited, an appreciation of various aspects of the invention may be obtained through a discussion of various application examples in such an environment.

According to one example embodiment of the present invention, a process of fabricating a dynamic random access memory cell having an access transistor and a storage capacitor includes the implementation of a shallow trench capacitor. The process includes selectively removing portions of a substrate to form at least one shallow trench in the substrate, and then doping regions of the substrate defining the base and sidewalls of the trench to form a first plate of the storage capacitor. A capacitor dielectric is then formed in the trench, with a portion of the trench left unfilled. Finally, a polysilicon layer is formed in the unfilled portion of the trench and over the capacitor dielectric to form the other plate of the storage capacitor, with the polysilicon layer's sidewalls facing the sidewalls of the trench.

Another important aspect of the present invention is directed to a dynamic random access memory (DRAM). In a particular example embodiment, the DRAM includes a first memory cell disposed on a substrate. The cell includes a first access transistor and a first storage capacitor coupled to the first access transistor. The first storage capacitor includes a first shallow trench in the substrate, and a first doped region of a first conductivity type in portions of the substrate defining the base and sidewalls of the first trench. The first doped region forms a first plate of the first storage capacitor. The first storage capacitor further includes a first capacitor dielectric disposed in the first trench, and a first polysilicon layer forming a second plate of the first storage capacitor. The second plate is disposed in the first trench over the first capacitor dielectric, and the first polysilicon layer has sidewalls facing the first trench sidewalls to increase the capacitance per unit area of the first storage capacitor.

Turning now to the figures, FIG. 1 illustrates a cross-sectional view of a portion of a DRAM cell, according to one example embodiment of the present invention, employing shallow trench isolation (STI) at region 10, self-aligned contacts 12, a very thin capacitor dielectric 16, and use of the STI region 10 to increase capacitance. This structure is used to provide a reduced-size capacitor cell without requiring a significant departure from a standard single-poly high performance logic process.

The structure of FIG. 1 is formed by selectively removing portions of a substrate 6 using, for example, a patterned mask to form a capacitor trench 18 and a shallow isolation trench 10 surrounding the capacitor trench 18. These trench regions are formed simultaneously, thereby simplifying the process. Following formation of the shallow trenches they are filled with thermal oxide, for example, using a silicon nitride mask or $SiO_2$ CVD methods. The filled trenches are then planarized using chemical mechanical polishing (CMP). As part of the CMP step, the silicon nitride mask may be advantageously used as a stopping layer.

The STI regions may also be filled following the formation of the patterned nitride film, according to one embodiment. This is done by partially filling using thermal oxidation, and then with completion of the filling using CVD $SiO_2$ methods. The substrate is then planarized using CMP.

Following formation of the filled STI regions, the oxide is removed selectively in the capacitor areas (such as trench 18) by the conventional use of patterned photoresist and etching.

The thin dielectric in the capacitor region, and for the transfer transistor, can be formed in various ways. According to a first particular embodiment, a thin oxide is formed in both regions by thermal oxidation to a thickness of approximately 30 Å. Its electrical properties can be enhanced by using conventional $N_2+O_2$ mixtures or NO as is known in the art.

In order to provide enhanced performance, DRAMs may operate such that the voltage on the word line is higher than the voltage on the capacitor. Consider, for example, conventional designs using a capacitor voltage of $V_{cc}/2$. To assure reliability, the dielectric for the transistor gate oxide may be made thicker than that for the capacitor. For a $V_{cc}$ of about 1.5V, a suitable design goal is a thickness of 40 Å to 45 Å for the transistor and a 30 Å equivalent $SiO_2$ thickness for the capacitor. For DRAM designs using boosted word lines, the thin dielectric thickness of the transistor may be increased as is well known in the art. For detailed information concerning power supply voltage and suitable gate oxide thicknesses, reference may be made to Chenming Hu, IEDM 1996, pg. 319, incorporated herein by reference.

Separate dielectric thicknesses can be grown by first growing the dielectric to approximately 20 Å, stripping the oxide using a patterned mask from the capacitor area, and then re-growing the oxide to realize a thickness of about 45 Å in the transistor area and about 30 Å in the capacitor area. This process is known in the art. According to the present invention, a similar process may be used wherein DRAM and logic are combined within one chip and the DRAM gate oxide is thicker than formed for the logic transistors. This allows a safe word line boost in the DRAM section.

Also consistent with the present invention, another dielectric formation process evolves a thin layer of $Si_3N_4$ which may be selectively formed over the capacitor area only (e.g., by a deposition and photolithography step as is well known in the art). Then the $Si_3N_4$ is oxidized to form an NO dielectric. This step simultaneously forms a transistor gate oxide of approximately 45 Å in thickness. The capacitor dielectric may be similarly formed as a conventional ONO layer, with an equivalent $SiO_2$ thickness of about 30Å.

For further information concerning ONO layers used in the DRAM applications, reference may be made to: Pierre C. Fazan, et al., "Thin Nitride Films on Textured Polysilicon to Increase Multimegabit DRAM Cell Charge Capacity," IEEE Electron Dev. Letters, 11 No. 7, July 1990, pg. 279.

Alternatively, a nitrogen implant may be selectively directed into the capacitor area and then the gate and capacitor oxide grown simultaneously. One such nitrogen implant process has been discussed by C. T. Liu, et al. in "High Performance 0.2 μm CMOS with 25 Å Gate Oxide Grown on Nitrogen Implanted Si Substrates," IEDM 1996, pg. 499. As discussed therein, a 45 Å gate oxide and a 30↑ capacitor oxide may be grown simultaneously after implanting nitrogen in the capacitor area using a dose of about $4\times10^{14}$ cm$^{-2}$, and the quality of the nitrogen implanted oxide is improved. Life test data for p-MOS shows a 10 year life for a 10% $V_T$ shift with a −4V stress.

Each of these references is incorporated herein by reference.

Following formation of the capacitor and transistor thin dielectric layers, portions 6a, 6b of the substrate 6 are then doped to define the base (or floor) and sidewalls of the capacitor trench 18 and to form a first doped silicon plate 14 of a storage capacitor.

A polysilicon layer 22 is then formed in the unfilled portion of the capacitor trench 18 and over the capacitor dielectric 16 to form a second plate of the storage capacitor, with the polysilicon layer 22 having sidewalls that face the sidewalls of the capacitor trench 18 and having a base that faces the base of the capacitor trench 18. The same polysilicon coating is used to form a transistor gate electrode 19. A silicide layer 23 may be deposited over doped poly layer 22.

The p-channel transfer transistor shown in FIG. 1 may be in the usual form of an LDD-type device with dielectric spacers 24 as are well known in the art.

Since the example given here shows a p-channel transfer transistor, the polysilicon may be doped p-type to improve various submicron characteristics as is known in the art. For n-channel versions of the invention, the polysilicon can be doped n-type.

Doping portions of the substrate 6 to form the first plate 14 of the storage capacitor can be accomplished using a "High-C" implant and using a patterned photoresist layer as a mask. For instance, a p-type dopant can be implanted into a first region 6a of the substrate, and an n-type dopant can be implanted into a second, deeper region of the substrate. These implants are done prior to the deposition of the polysilicon layer.

In one embodiment, a High-C implant is used to provide junction capacity in parallel to the thin film capacitor. The High-C implant decreases the amount of capacitor area that is needed. Such a High-C implant can be implemented with the following five-layer structure: N+ polysilicon capacitor plate/30 Å $SiO_2$ or equivalent dielectric/a shallow p+ region ($10^{19}$ to $10^{20}$ cm$^3$)/a shallow n+ region (about $5\times10^{18}$ cm$^3$)/n-type well (about $10^{17}$ cm$^3$).

In a specific embodiment, the concentration of the first p-type dopant ranges from about $10^{19}$ to $10^{20}$ dopants/cm$^3$, the concentration of the second n-type dopant is about $5\times10^{18}$ dopants/cm$^3$, and an n-well region 28 is formed in the substrate with the first and second dopants implanted into the n-well.

FIG. 2 illustrates a layout perspective of a DRAM array, with the DRAM cell 39 (shown in dotted lines) of FIG. 1 shown as a cross section in direction of the directional dashed lines of FIG. 2. The inner regions 40 illustrate the oxide being removed from the STI region 42 adjacent the capacitor 44. The self-aligned contacts (SACs) 46 are shown adjacent word lines 50.

Figure 3A:
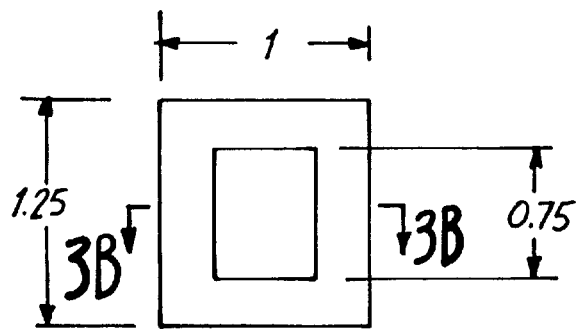
FIG. 3a illustrates a specific layout perspective of a structure for a capacitor, according another example embodiment of the present invention.
Figure 3B:
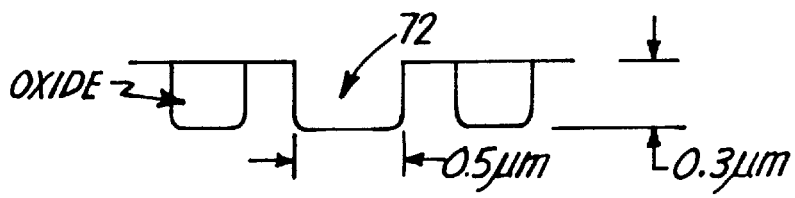
FIG. 3b illustrates a cross-sectional view of the structure of FIG. 3a, with dimensions shown according a specific embodiment of the present invention.

FIGS. 3a and 3b respectively illustrate a specific example layout perspective and cut-away view thereof of a structure for a capacitor as would be used in a DRAM cell array, such as the array of FIG. 2. The cell area shown in FIG. 3a is 2 μm$^2$, defined by a 1 μm×1.25 μm structure. For 0.25 micron design rules (f=0.25), the cell shown in FIG. 3a is 42.5 features squared, or 2.6 μm$^2$. FIG. 3b illustrates a cross-sectional view of the DRAM cell of FIG. 3a, with the width of the capacitor trench 72 defined at 0.5 μm and the depth of both the STI trench (not shown) and capacitor trench defined at about 0.3 μm.

Figure 4A:
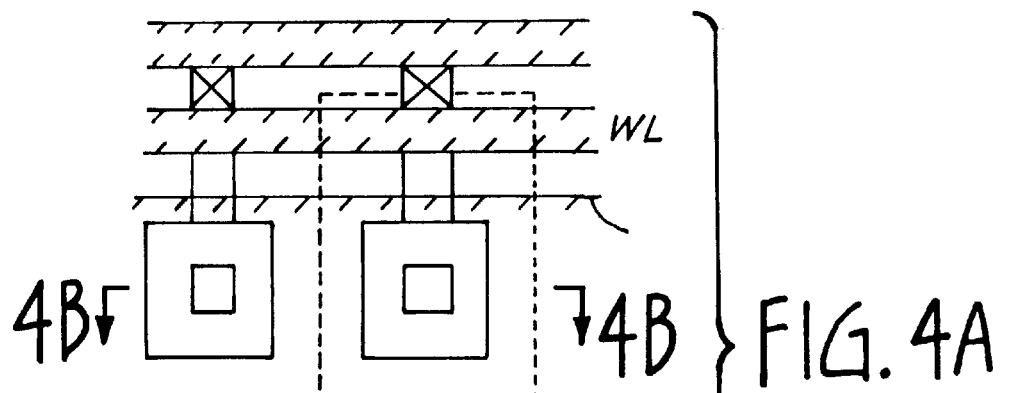
FIGS. 4a and 4b respectively illustrate an alternative layout structure by way of perspective and cross-sectional views of a DRAM cell, according another specific embodiment of the present invention.
Figure 4B:
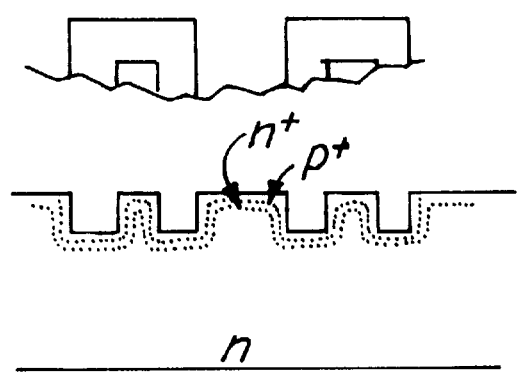

FIGS. 4a and 4b respectively illustrate an alternative layout structure by way of perspective and cross-sectional views of a DRAM cell, according another specific embodiment of the present invention. Using this structure, a DRAM cell is formed using separate masks to position the n+ and p+ high-C implants such that the n+ region prevents leakage from adjacent capacitors even though there is not a STI region separating them. The capacitor to capacitor separation in this structure is set to two features squared ("2f") for placement of the p+ mask.

The various embodiments described above are provided by way of illustration only and are not intended to limit the invention. Those skilled in the art will readily recognize various modifications and changes that may be made to the present invention without strictly following the example embodiments and applications illustrated and described herein. The scope of the present invention is set forth in the following claims.

What is claimed is:

1. A process of fabricating a memory cell, comprising:

selectively removing portions of a substrate using a patterned mask to simultaneously form a capacitor trench and an isolation trench at least partially around the capacitor trench;

forming an oxide in the isolation trench and the capacitor trench;

selectively removing the oxide in the capacitor trench;

doping portions of the substrate defining the base and sidewalls of the capacitor trench;

forming a capacitor dielectric in the capacitor trench, a portion of the trench unfilled; and forming a polysilicon layer in the unfilled portion of the capacitor trench and over the capacitor dielectric to form a plate of the storage capacitor.

2. The process of claim 1, wherein forming the oxide in the isolation trench and the capacitor trench includes oxidizing the substrate to grow a thermal oxide in each trench and depositing a layer of oxide over the thermal oxide to fill unfilled portions of each trench.

3. The process of claim 1, wherein selectively removing the oxide in the capacitor trench includes:

forming a photoresist over the substrate;

removing portions of the photoresist to form a patterned photoresist layer selectively exposing the capacitor trench and covering the isolation trench; and etching the oxide in the exposed capacitor trench.

4. The process of claim 3, wherein doping portions of the substrate to form the first plate of the storage capacitor includes implanting dopant into the substrate using the patterned photoresist layer as a mask.

5. The process of claim 4, wherein doping portions of the substrate includes:

implanting a first dopant into a first region of the substrate; and implanting a second dopant of a conductivity type opposite that of the first dopant into a second, deeper region of the substrate.

6. The process of claim 5, wherein the first dopant is a p-type dopant and the second dopant is an n-type dopant.

7. The process of claim 6, wherein the concentration of the p-type dopant ranges from about $10^{19}$ to $10^{20}$ dopants/cm$^3$.

8. The process of claim 6, wherein the concentration of the n-type dopant is about $5 \times 10^{18}$ dopants/cm$^3$.

9. The process of claim 6, further including forming an n-well in the substrate, wherein the first dopant and second dopant are implanted into the n-well.

10. The process of claim 1, wherein forming a capacitor dielectric in the capacitor trench includes forming an oxide in the capacitor trench.

11. The process of claim 10, wherein the oxide is a nitrogen-bearing oxide.

12. The process of claim 1, wherein the isolation trench and capacitor trench each have comparable depths.

13. A process of fabricating a dynamic random access memory cell having an access transistor and a storage capacitor, comprising:

forming, over a substrate, a patterned nitride layer exposing portions of the substrate defining an isolation region and a capacitor region within the isolation region;

etching exposed portions of the substrate using the patterned nitride layer to form an isolation trench in the isolation region and a capacitor trench in the capacitor region within the isolation region;

oxidizing substrate to form a thermal oxide layer in the isolation trench and the capacitor trench;

depositing an oxide layer over the thermal oxide layer to fill unfilled portions of the isolation trench and the capacitor trench;

removing the patterned nitride mask;

planarizing the substrate;

forming, over the substrate, a patterned photoresist layer selectively exposing the deposited oxide layer in the capacitor trench;

selectively etching the deposited oxide layer and the thermal oxide layer in the capacitor trench using the patterned photoresist as a mask;

doping portions of the substrate defining the base and sidewalls of the capacitor trench using the patterned mask, the doped region forming a first plate of the storage capacitor;

removing the patterned photoresist;

oxidizing the substrate to grow a capacitor oxide in the capacitor trench and a gate oxide over a region of the substrate near the capacitor trench;

forming a polysilicon layer over the substrate;

selectively removing portions of the polysilicon layer to form a second plate of the storage capacitor over the capacitor trench and a gate electrode of the access transistor over the gate oxide; and selectively doping regions of the substrate adjacent the gate electrode to form source/drain regions of the access transistor in the substrate, at least one source/drain region being coupled to the doped region storage forming the first capacitor plate.

* * * * *